United States Patent [19]

Seiler

[11] Patent Number: 5,207,885
[45] Date of Patent: May 4, 1993

[54] TARGET FOR REACTIVE SPUTTERING

[75] Inventor: Reiner Seiler, Hanau, Fed. Rep. of Germany

[73] Assignee: Leybold Aktiengesellschaft, Hanau I, Fed. Rep. of Germany

[21] Appl. No.: 790,417

[22] Filed: Nov. 7, 1991

[30] Foreign Application Priority Data

Sep. 19, 1991 [DE] Fed. Rep. of Germany ....... 4131181

[51] Int. Cl.$^5$ ............................................. C23C 14/34
[52] U.S. Cl. ........................ 204/298.13; 204/192.15; 204/192.26; 420/557; 420/563
[58] Field of Search ................... 204/192.15, 192.26, 204/192.27, 298.13, 192.28; 420/557, 563

[56] References Cited

U.S. PATENT DOCUMENTS

| | | | |
|---|---|---|---|
| 3,907,660 | 9/1975 | Gillery | 204/298 |
| 4,099,199 | 7/1978 | Wittry | 204/192.26 X |
| 4,149,308 | 4/1979 | Smith | 204/192.26 X |
| 4,806,220 | 2/1989 | Finley | 204/192.26 X |
| 4,806,221 | 2/1989 | Gillery | 204/192.26 X |
| 4,948,529 | 8/1990 | Ritchie et al. | 204/192.26 X |
| 4,948,677 | 8/1990 | Gillery | 204/192.26 X |
| 4,960,645 | 10/1990 | Lingle et al. | 204/192.26 X |

FOREIGN PATENT DOCUMENTS 283881 9/1988 European Pat. Off. .

Primary Examiner—Nam X. Nguyen
Attorney, Agent, or Firm—Felfe & Lynch

[57] ABSTRACT

Target for reactive sputtering in a vacuum coating apparatus consists of at least one of tin and lead doped with 20 to 200 ppm gallium and 2 to 20 ppm phosphorus.

4 Claims, 2 Drawing Sheets

TARGET FOR REACTIVE SPUTTERING

BACKGROUND OF THE INVENTION

The invention relates to a vacuum coating apparatus with a target formed on a basis of tin or lead by which one or more layers are applied to a substrate by sputtering in a reactive atmosphere.

It is already generally known in vacuum coating apparatus the principle of cathode sputtering to use a reaction gas in addition to a sputtering gas such as argon. $O_2$, $N_2$, $CH_4$ or $H_2S$ among others are used as the reactive gases for sputtering. In the case of tin targets, oxygen is used as the reactive gas in order to apply a tin oxide coating to the substrate. This reactive sputtering process is greatly appreciated in certain manufacturing processes, because it permits the preparation of compounds in an especially repeatable manner, i.e., it leads to transparent coatings. In the use of tin and/or lead targets in conjunction with oxygen as the reactive gas, an oxide coating also forms on the surface of the target after a brief processing time, so that after comparatively long use the target has to be cleaned. Consequently the manufacturing process becomes relatively expensive due to the short length of time for which the target can be used.

SUMMARY OF THE INVENTION

The invention solves the problems of formation of oxidation and impurities, especially pitting, on the surface of a tin or lead target; by admixing at least one additional metal to the target.

In this manner oxidation of the target can be reduced or prevented in a simple, very low-cost manner, so that even after relatively long use it is no longer necessary to clean the target, i.e., the life of the target can be increased overall.

For this purpose it is advantageous for the target containing tin or lead to contain gallium and/or phosphorus.

It is furthermore advantageous for the ratio of the atomic parts of gallium to phosphorus to be between 15:1 and 5:1.

An additional possibility, according to a further development of the vacuum coating apparatus according to the invention, is for tin to be doped with approximately 100 ppm gallium and with approximately 10 ppm phosphorus.

In further development of the invention it is advantageous, in the case of vacuum coating apparatus for coating an end product, especially a glass surface, with a target formed from tin, to apply to the surface of the glass a layer of SnO as the ground coat, then a heat-reflecting coating, especially of Ag, and then as the third layer SnO with contents of Ga and P.

According to the preferred embodiment of the solution according to the invention, it is finally provided that a first and/or the third coating of tin applied to the glass surface contains between 20 and 200 ppm and gallium between 2 and 20 ppm phosphorus.

DETAILED DESCRIPTION OF THE PREFERRED EMBODIMENT

Figure 2:
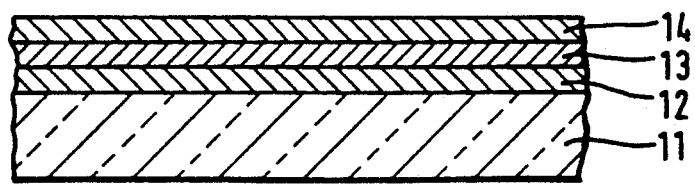
FIG. 2 shows a barrier layer on a glass surface.
Figure 1B:
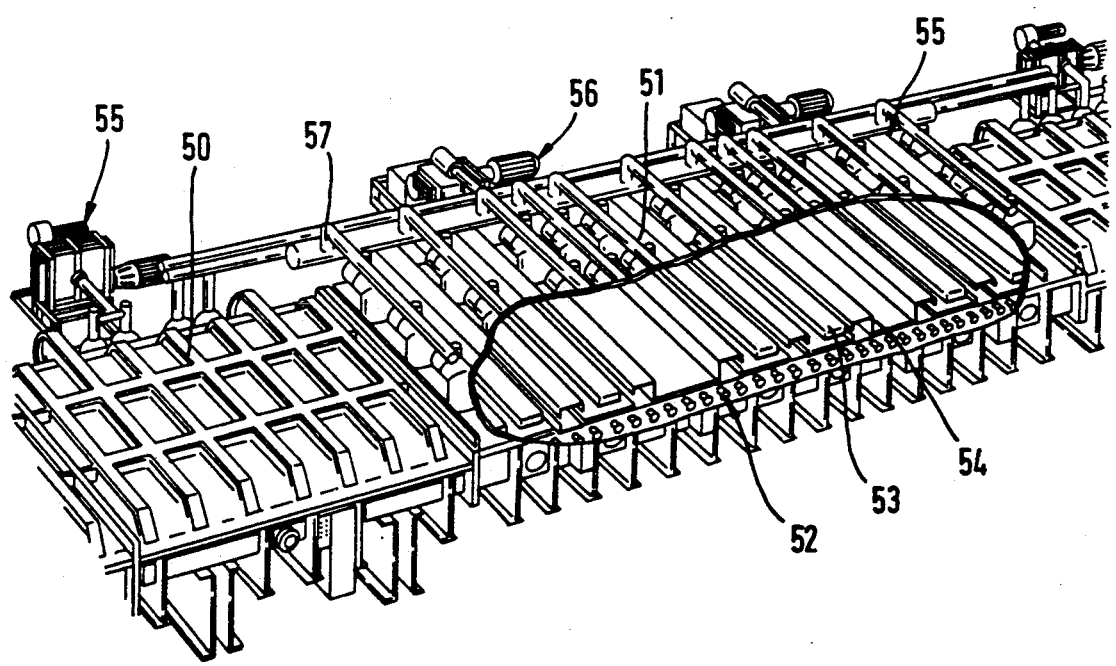
FIG. 1b is a perspective depiction of the entire coating apparatus according to FIG. 1.

In the drawing, a substrate 1 is to be provided with at least one or, as seen in FIG. 2, with a plurality of thin barrier layers. This substrate 1 confronts a target 3 which is to be sputtered. The target 3 is connected by an element 4 that is U-shaped in section to a cathode 5 which rests on a yoke 6 which encloses between itself and the element 4 three permanent magnets 7, 8 and 9. The polarities of the poles of the three permanent magnets 7, 8 and 9 aimed at the target alternate, so that the south poles of the two outer permanent magnets 7 and 9 form with the north pole of the middle permanent magnet 8 through the target 3 an approximately arcuate magnetic field. This magnetic field compresses the plasma in front of the target 3, so that it has its greatest density at the point where the magnetic fields have the peak of their arc. The ions in the plasma are accelerated by an electrical field which forms on the basis of a direct current that is put out by a direct-current source 10. This direct-current source 10 is connected by its negative pole through two inductances 20 and 21 to the cathode 5. The electrical field stands vertically on the surface of the target 3 and accelerates the positive ions of the plasma toward the target 3 which is disposed in a process chamber 25 and in a container 24. Thus, a more or less great number of atoms or particles are knocked out of the target 3, especially from areas 33 and 34 where the magnetic fields have their maxima. The sputtered atoms or particles migrate toward the substrate 1, which is underneath a mask 26 on the floor of container 24, where they deposit themselves as a thin layer 2. For the control of the system represented a processing computer not represented in the drawing can be provided, which processes the measurement data and issues controlling commands. For example, the data on the partial pressure measured in the coating chambers 15 and 15a can be fed to this processing computer. On the basis of these and other data the computer can, for example, regulate a flow of reactive gas from a tank 16 or another gas flow from a tank 17 by means of valves 18 and 19 inserted into a feed line 22, and by means of valves 30 and 31 inserted into a feed line 23, respectively, and adjust the voltage at the cathode 5. The process computer can also monitor all other variables, such as the power input for example.

Figure 1:
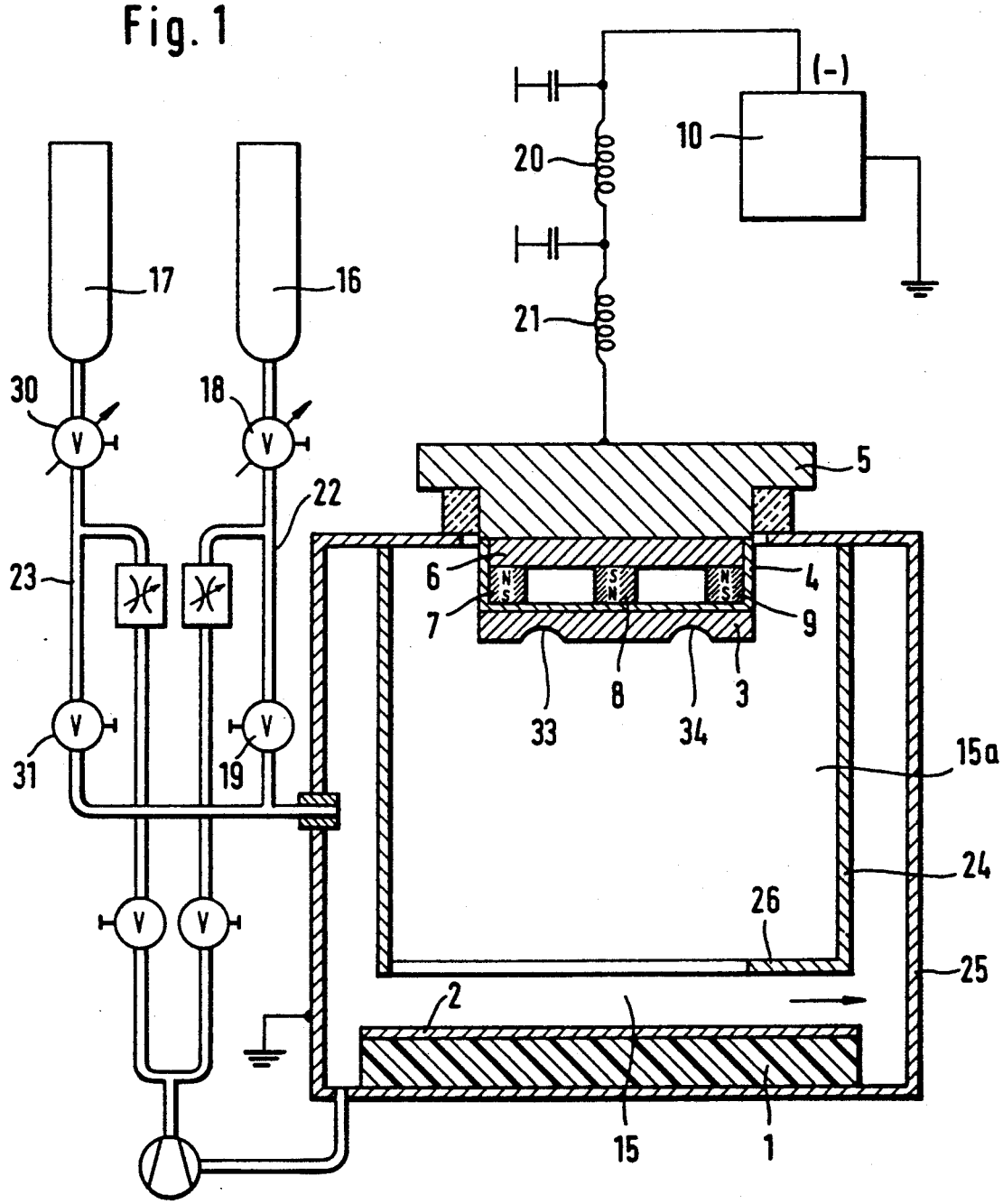
FIG. 1 shows a coating apparatus for a process for the production of a barrier layer.

The apparatus represented in FIG. 1 can be part of a band coating apparatus or of an in-line band coating apparatus for the coating of substrates or glass, the target 3 being made on a basis of tin and/or lead. Coating the glass surface with a plurality of individual layers is performed through several stations of the band coating apparatus arranged in tandem, which for the sake of simplicity are not represented in the drawing.

If a glass surface, for example, is coated, the target contains tin, among other substances. In the process of coating in a reactive atmosphere, that is, if oxygen is added, oxidation occurs on the surface of the target, so that after relatively long use the target has to be cleaned. This makes the manufacturing process relatively expensive on account of the short life of the target. This can be largely prevented by adding gallium and phosphorus to the target 3 containing tin or lead.

Tin and/or lead can be contained in the target doped with approximately 100 ppm gallium and with approximately 10 ppm phosphorus. In this manner, in the reactive sputtering with tin and/or lead targets, oxidation of the target and/or impurities, especially pitting, can be prevented or their formation retarded.

According to the embodiment in FIG. 2, a ground coat 12 is applied to the glass surface 11 and, as the third layer 14, SnO with contents of gallium and phosphorus, is applied to the glass surface 11, while between the two layers a heat-reflecting layer 3 especially Ag, is applied between the two layers 12 and 14. For this purpose a corresponding target of the material to be applied is used.

LIST OF REFERENCE NUMBERS

1: substrate
2: barrier layer
3: target
4: element
5: cathode
6: yoke
7: permanent magnet
8: permanent magnet
9: permanent magnet
10: DC current source
11: glass surface
12: ground coating
13: heat-reflecting layer
14: third layer
15, 15a: coating chamber
16: tank
17: tank
18: valves
19: valves
22: feed line
23: feed line
24: container
25: process chamber
26: mask
30: valve
31: valve
33: area
34: area

I claim:

1. Target for reactive sputtering in a vacuum coating apparatus, said target consisting of at least one of tin and lead doped with 20 to 200 ppm gallium and 2 to 20 ppm phosphorus.

2. Target as in claim 1 wherein said target consists of tin doped with 20 to 200 ppm gallium and 2 to 20 ppm phosphorus.

3. Target as in claim 1 wherein said target is doped with 100 ppm gallium and 10 ppm phosphorus.

4. Target as in claim 1 wherein said target is doped with gallium and phosphorus in a ratio between 5 to 1 and 15 to 1.

* * * * *